United States Patent
Tokumitsu et al.

(10) Patent No.: US 6,529,051 B2
(45) Date of Patent: Mar. 4, 2003

(54) FREQUENCY MULTIPLIER WITHOUT SPURIOUS OSCILLATION

(75) Inventors: Tsuneo Tokumitsu, Yamanashi-ken (JP); Osamu Baba, Yamanashi-ken (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/793,695

(22) Filed: Feb. 27, 2001

(65) Prior Publication Data

US 2001/0017556 A1 Aug. 30, 2001

(30) Foreign Application Priority Data

Feb. 29, 2000 (JP) .......................... 2000-057930

(51) Int. Cl.⁷ ............................................. H03B 19/00
(52) U.S. Cl. ...................... 327/119; 327/116; 327/123; 333/218
(58) Field of Search ................................ 327/119, 116, 327/120, 121, 122, 123, 356, 357, 358; 333/218; 363/159, 163; 326/21–30; 455/313, 323, 326

(56) References Cited

U.S. PATENT DOCUMENTS

| | | | |
|---|---|---|---|
| 4,176,332 A | * 11/1979 | Bachert | 333/218 |
| 4,327,343 A | * 4/1982 | Cornish | 333/218 |
| 4,592,095 A | * 5/1986 | Ohnishi et al. | 455/327 |
| 4,734,591 A | * 3/1988 | Ichitsubo | 327/122 |
| 4,754,244 A | 6/1988 | Pavio | 333/218 |
| 4,931,921 A | * 6/1990 | Anderson | 363/163 |
| 5,060,298 A | * 10/1991 | Waugh et al. | 455/326 |
| 5,379,457 A | * 1/1995 | Nguyen | 455/323 |
| 5,392,014 A | * 2/1995 | Nashida et al. | 333/218 |
| 5,495,194 A | * 2/1996 | Sugawara | 327/113 |
| 5,661,437 A | * 8/1997 | Nishikawa et al. | 330/282 |
| 5,678,226 A | * 10/1997 | Li et al. | 455/333 |
| 5,789,963 A | * 8/1998 | Sakusabe | 327/356 |
| 5,884,154 A | * 3/1999 | Sano et al. | 455/333 |
| 5,886,595 A | * 3/1999 | Von Stein | 333/218 |
| 6,057,714 A | * 5/2000 | Andrys et al. | 327/105 |
| 6,066,997 A | * 5/2000 | Matsugatani et al. | 333/218 |
| 6,111,477 A | * 8/2000 | Klymyshyn et al. | 333/139 |
| 6,160,425 A | * 12/2000 | Laurent et al. | 327/113 |
| 6,198,365 B1 | * 3/2001 | Yamada | 333/218 |
| 6,388,546 B1 | * 5/2002 | Kikokawa et al. | 333/218 |

FOREIGN PATENT DOCUMENTS

| | | |
|---|---|---|
| JP | 4189002 | 7/1992 |
| JP | 7263997 | 10/1995 |
| JP | 2807508 | 7/1998 |
| JP | 10-341115 | 12/1998 |
| JP | 11298202 | 10/1999 |

* cited by examiner

Primary Examiner—Timothy P. Callahan
Assistant Examiner—Hai L. Nguyen
(74) Attorney, Agent, or Firm—Armstrong, Westerman & Hattori, LLP (57) ABSTRACT

A damping resistance 20 is connected between the drain D of an FET 10 and a first end T3 of an output transmission line 13, and a damping resistance 21 is connected between the drain D of an FET 11 and the first end T3. The source of the FET 10 and the gate of the FET 11 are connected to a ground plane on the back surface of a substrate through a via which has a parasitic inductance when a multiplied frequency exceeds 20 GHz. The gate of the FET 10 and the source of the FET 11 receive microwaves of the same frequency and phase through an input transmission line 12.

25 Claims, 12 Drawing Sheets

FREQUENCY MULTIPLIER WITHOUT SPURIOUS OSCILLATION

BACKGROUND OF THE INVENTION

The present invention relates to a frequency multiplier without spurious oscillation, and particularly, to a frequency multiplier producing a microwave or a millimeter wave signal having double or quadruple the frequency of an incoming fundamental microwave signal of the order of 10 GHz or higher.

Figure 14:
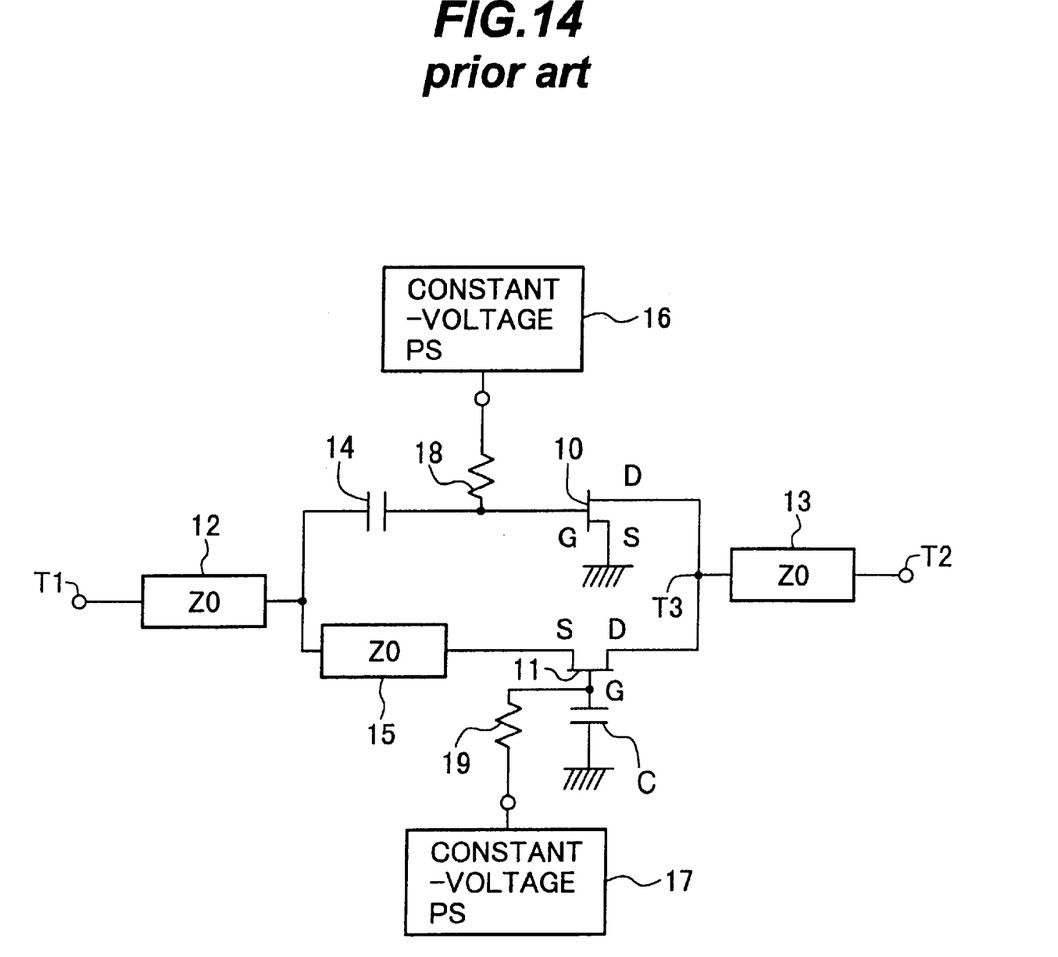
FIG. 14 is a circuit diagram showing a prior art balanced frequency multiplier.

FIG. 14 is a circuit diagram showing a balanced frequency multiplier disclosed in JP No. 2807508.

This frequency multiplier includes a common source FET 10 and a common gate FET 11, wherein the gate G, as the input, of the FET 10 and the source S, as the input, of the FET 11 are both coupled to an input transmission line 12, and the drain D, as the output, of the FET 10 and the drain D, as the output, of the FET 11 are both connected directly to an output transmission line 13.

A dc cutoff capacitor 14 is connected between the gate G of the FET 10 and the input transmission line 12, and a reactance element 15 producing a phase lag is connected between the source S of the FET 11 and the input transmission line 12.

In order to operate the FETs 10 and 11 near the pinch-off, dc bias voltages are applied to respective gates of the FETs 10 and 11 from respective constant-voltage power sources 16 and 17 through respective resistances 18 and 19. A dc cutoff capacitor C is connected between the gate of the FET 11 and ground.

When a sine wave is provided to a microwave input terminal T1, the FET 10 rectifies the positive half cycles of the sine wave, while the FET 11 rectifies the negative half cycles of the sine wave and inverts the polarity thereof. Thereby, a fundamental and odd harmonics included in the drain current of the FET 10 are in opposite phase to respective those of the FET 11, and they are mutually canceled at an output terminal T2. In contrast to this, since even harmonics included in the drain current of the FET 10 are in phase with those of the FET 11, they are mutually enhanced at the output terminal T2. The amplitude of the fourth harmonic is considerably smaller than that of the second harmonic.

By properly determining the impedance of the reactance element 15, it is possible to prevent shifts from being in phase and in opposite phase at the output terminal T2, caused by a difference in transmission characteristics between the FET 10 and the FET 11.

According to the frequency multiplier of FIG. 14, since it is not required to provide a hybrid circuit for producing a pair of fundamentals in opposite phase from an incoming fundamental microwave signal, the frequency multiplier has an advantage in downsizing.

However, the present inventors found that this frequency multiplier has a below problem when it receives a microwave having a frequency of the order of 10 GHz or higher.

That is, when the input frequency exceeds the order of 10 GHz and as a result, the output frequency exceeds 20 GHz, then the common gate FET 11 comes to show unstableness such as a negative resistance at the gate G or the drain D thereof. In this case, it was not possible to prevent a spurious oscillation from occurring although an attenuator was connected near the output terminal T2 as a countermeasure.

It has been a common practice that in design of the above described frequency multiplier, a stub is connected to the drain D of the FET 11 to supply a dc bias and furthermore, impedance matching is achieved such that the output is maximized in regard to a target multiplied frequency.

However, there arises oscillation due to a combination of the stub and the negative resistance or due to a closed loop including the FETs 10 and 11. The spurious oscillation becomes remarkable especially in a case where a matching between the output of the frequency multiplier and an output buffer amplifier connected thereto is seriously poor (a reflection coefficient is a value close to 1).

Further, when realizing a frequency multiplier by 4 with deleting the second harmonic, an output frequency comes into a millimeter waveband, therefore it is required to employ the common gate FET 11 having a high performance (the maximum oscillating frequency fmax, or the maximum response frequency, is high) sufficient to realize the frequency multiplier by 4, resulting in that the negative resistance or a reflection gain of the common gate FET 11 becomes larger, which makes the above problem more serious.

Causes by which the negative resistance arises are a parasitic inductance of a conductor for grounding the gate G of the FET 11 and a tiny parasitic feedback capacitance between the drain D and the source S of the FET 11. Since the common gate FET especially has its output signal in phase with its input signal, the parasitic inductance forces the common gate FET 11 to produce positive feedback (in a common source FET whose output signal is in opposite phase with its input signal, negative feedback is produced and the common source FET is usually employed in a low-noise amplifier).

In formation of a common gate FET, it is indispensable to form a kind of lead for grounding, such as a bonding wire, a via formed in a substrate, or a lead up to the grounded conductor of a co-planar line. Alternatively, there is available a method of grounding by forming a ¼ wavelength transmission line with an open end on a substrate. However, since grounding is achieved only for a given frequency component or band, the parasitic inductance arises except for the given frequency component or band.

Consequently, there have been a problem that a circuit including a common gate FET is rendered unstable with ease in a millimeter waveband or a high frequency waveband close thereto since it is hard to decrease the parasitic inductance to such a small value that no unstableness is brought about for all frequencies in operation of a common gate FET.

SUMMARY OF THE INVENTION

Accordingly, it is an object of the present invention to provide a stable frequency multiplier without spurious oscillation due to a inevitable parasitic inductance of a conductor for grounding a control input of a transistor.

In one aspect of the present invention, there is provided a frequency multiplier comprising: a first damping resistance, connected between a first end of the current path of a first transistor and an output transmission line; and a second damping resistance, connected between a first end of the current path of a second transistor and the output transmission line. Each of a second end of the first current path and a control input of the second transistor is grounded through a conductor having an inevitable parasitic inductance. The control input of the first transistor and the second end of the second current path receive microwaves of the same frequency and phase through an input transmission line.

With this configuration, when the input transmission line receives a sine microwave, the first transistor rectifies the positive half cycles of the sine microwave, while the second transistor rectifies the negative half cycles thereof and inverts their polarity. Thereby, the fundamentals and the odd harmonics on the output transmission line coming from the first and second current paths are in opposite phase and canceled by each other. In contrast to this, the even harmonics on the output transmission line coming from the first and second current paths are in phase and enhanced by each other.

Although the amplitudes of the waves passing through the first and second damping resistances are reduced, no shift in phase occurs. Hence, the even harmonics in phase are enhanced on the output transmission line.

The negative resistance is produced by the parasitic inductance of the conductor grounding the control input of the second transistor. However, the second damping resistance negates the formation of a pseudo-oscillating circuit comprising the second transistor and the output transmission line. That is, a loss on the output transmission line functioning as a resonator of the pseudo-oscillating circuit can be increased to nullify the establishment of oscillating conditions at an any frequency. Hence, even if design parameters are determined so as to produce a wave having a multiplied high frequency such as a millimeter wave, a stable frequency multiplier having none of spurious oscillation can be realized.

In a case where a possibility exists that oscillation occurs in a loop including the first and second transistors, a loop oscillation can be suppressed by determining the values of the first and second damping resistances such that a loop gain is less than 1.

Further, since an attenuator can be constituted of a combination of series and parallel resistances, by connecting a resistance between ground and a connection point among the first and second damping resistances and the output transmission line, impedance matching between the frequency multiplier and an output buffer amplifier connected to the output transmission line can be improved or a level diagram of the whole circuit including the frequency multiplier and the amplifier can be adjusted.

Since a bias current is provided through the first and second damping resistances to the current paths of the first and second transistors, voltage drops arise on the first and second damping resistances, and when one of the first and second transistors is in an ON state and the other is in an OFF state, the voltage of the current path of the ON state transistor is lower than the dc bias voltage thereof, while the current path of the OFF state transistor is maintained at a voltage almost equal to the dc bias voltage thereof. The voltage drop of the current path of the ON state transistor is larger as the value of the damping resistance increases. However, since the first and second transistors are biased near the respective threshold voltages, average current values flowing through the transistors are as low as, for example, 10 milliampere or lower, the voltage drop is 0.3 V at most when the damping resistance value is 30 ohm or less, and the loss of a frequency multiplying efficiency at the first and second transistors can be neglected.

According to a frequency multiplier of the present invention, a stable operation can be performed even there exists an inevitable parasitic inductance due to grounding conductor, a monolithic microwave integrated circuit (MMIC) can be realized in which a frequency multiplier, a fundamental oscillator at the preceding stage of the frequency multiplier, and an amplifier at the succeeding stage of the same are integrated on one chip having a ground plane formed on the back surface thereof.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
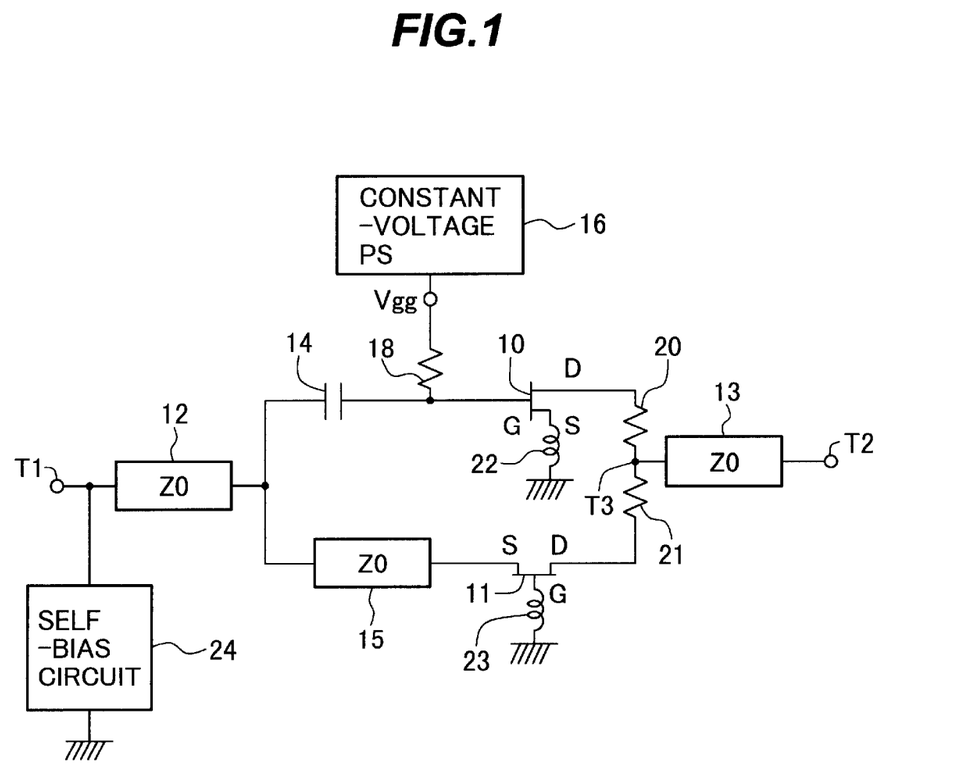
FIG. 1 is a circuit diagram showing a frequency multiplier of a first embodiment according to the present invention.

FIG. 1 is a circuit diagram showing a frequency multiplier of a first embodiment according to the present invention.

The input terminal T1 of an input transmission line 12 having a characteristic impedance Z0 receives an incoming fundamental microwave. The other end of the input transmission line 12 is connected, on one hand, through a dc bias cutoff capacitor 14 to the gate G, as a control input, of an FET 10 as a first transistor, and on the other hand, through a transmission line 15 to the source S which is a first end of the current path of an FET 11 as a second transistor. The transmission line 15 is employed for providing signals in phase to both of the FETs 10 and 11 by correcting a pass phase difference due to the parasitic capacitances of the FETs 10 and 11, the capacitance of the dc bias cutoff capacitor 14 and so on. A damping resistance 20 is connected between the drain D which is a first end of the current path of the FET 10 and an end T3 of an output transmission line 13, and another damping resistance 21 is connected between the drain D which is the second end of the current path of the FET 11 and the end T3 of the outward output transmission line 13.

The source S of the FET 10 and the gate G of the FET 11 are grounded through conductors having parasitic inductances 22 and 23, respectively. The gate of the FET 11 is grounded without through the capacitor C of FIG. 14. That is, the capacitor C of FIG. 14 is not employed in this first embodiment in order to avoid a difference between the parasitic inductances 22 and 23 due to a longer distance between the gate of the FET 11 and ground, which is increased by the area of the capacitor C and the conductor for grounding.

The gate G of the FET 10 is connected through a resistance 18 to a dc constant-voltage power source 16 outputting a voltage Vgg which is determined in such a way that the common source FET 10 operates near the pinch-off voltage of the FET 10.

The source of the FET 11 is connected through the transmission line 15 and the input transmission line 12 to a self-bias circuit 24 so that the common gate FET 11 operates near the pinch-off voltage of the FET 11.

When a sine wave is provided to the microwave input terminal T1, the FET 10 rectifies the positive half cycles of the sine wave, while the FET 11 rectifies the negative half cycles of the sine wave and inverts the polarity thereof. Thereby, the fundamental and the odd harmonics included in the drain currents of the FETs 10 and 11 are canceled by each other at the output terminal T3 since they are in opposite phase to each other. In contrast to this, the even harmonics included in the drain currents of the FETs 10 and 11 are enhanced by each other at the output terminal T3 since they are in phase with each other.

The gains of the fundamental and the harmonics included in the drain current of the FET 10 are made equal to respective those of the FET 11 by adjusting the output voltage of the dc constant-voltage power source 16 after adjusting the output voltages of the circuits 16 and 24 as described above.

As the amplitude of the incoming fundamental microwave signal is increased, the waveforms of both drain currents of the FETs 10 and 11 are gradually distorted with flattened top due to non-linearity of the FETs 10 and 11, resulting in increasing amplitudes of higher order harmonic components.

When the multiplied frequency exceeds 20 GHz, in other words, when field effect transistors having a very high value of the maximum oscillating frequency fmax, or of the maximum response frequency sufficient, are used as the FETs 10 and 11 in order to produce a wave having multiplied frequency more than 20 GHz, the parasitic inductance 23 effects such that a positive feedback arises between the drain and the source of the FET 11 to produce a negative resistance. On the other hand, the FET 10 is in the state of a negative feedback.

As in the prior art circuit of FIG. 14, when the output transmission line 13 is connected directly to the drains of the FETs 10 and 11 and a circuit having a low input impedance is connected at the output terminal T2, a reflective oscillating circuit is formed with ease and an undesired spurious oscillation arises. Even if the circuit connected at the output terminal T2 is in a good impedance matching state for a desired multiplied frequency, a spurious oscillation arises in a higher frequency waveband outside the desired multiplied frequency. This phenomenon is conspicuous when the prior art circuit of FIG. 14 employs transistors of high performance (high fmax).

In contrast to this, in this first embodiment, since the damping resistance 21 is connected between the drain of the FET 11 and the output transmission line 13, no oscillating condition is established even if a negative resistance arises, thereby enabling elimination of a spurious oscillation.

Further, since the damping resistance 20 is also connected between the drain of the FET 10 and the output transmission line 13, the amplitudes of the fundamental and the harmonics from the FET 10 can be equal to those from the FET 11.

The resistance values of both damping resistances 20 and 21 may be theoretically equal to each other. However, they may be different from each other so as to perform more suppression of synthesized fundamentals and odd harmonics in opposite phases at the output terminal T3 and more enhancement of synthesized even harmonics in phase at the output terminal T3.

In the prior art circuit of FIG. 14, a spurious oscillation arises not only in the above-described reflective oscillating circuit, but also in the loop in which a spurious signal reaches the gate of the FET 11 by backward transfer in the FET 11, the gate of the FET 10 through the transmission line 15 and the capacitor 14, and the drain of the FET 10 by forward transfer in the FET 10, and further goes back to the drain of the FET 11, when the loop gain is higher than 1. In this loop, the impedances at the points T3 and T1 are high. In a case where the FET 11 operates with a negative resistance due to the parasitic inductance, there is a possibility that the loop gain becomes larger than 1.

However, in the first embodiment, the loop gain is reduced by the damping resistances 20 and 21 to be smaller than 1, resulting in no spurious oscillation.

Second Embodiment

Figure 2:
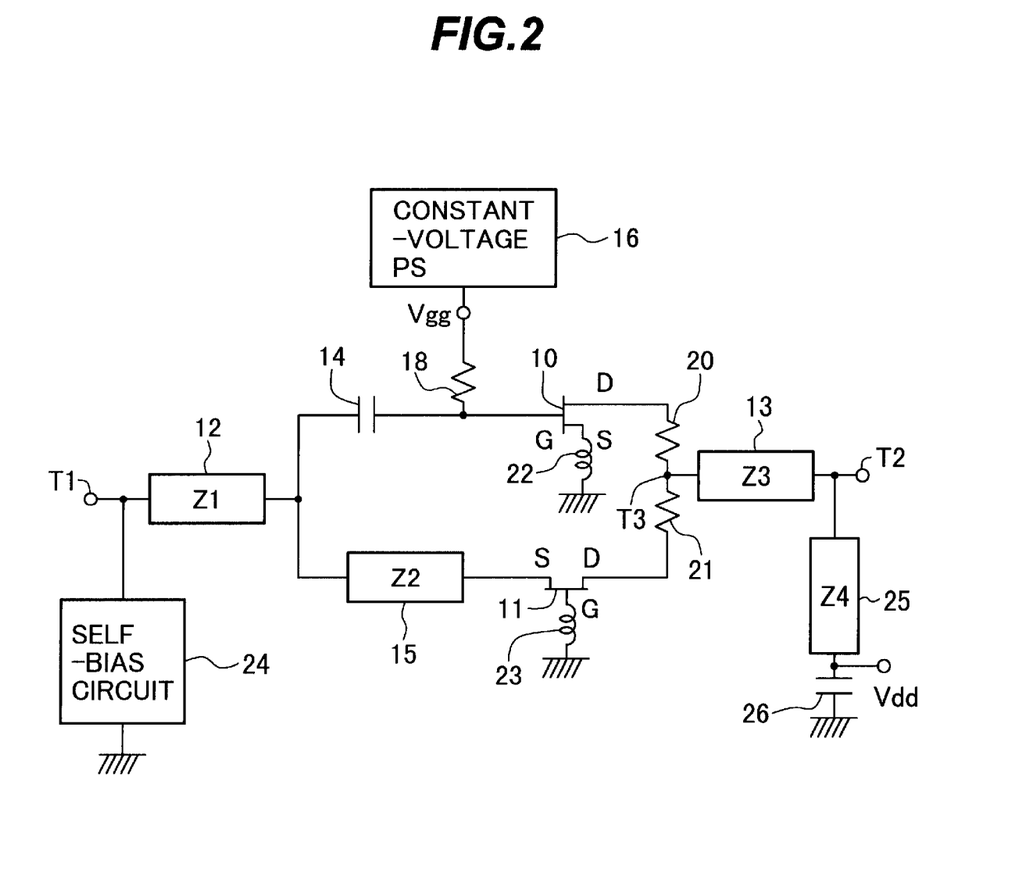
FIG. 2 is a circuit diagram showing a frequency multiplier of a second embodiment according to the present invention.

FIG. 2 is a circuit diagram showing a frequency multiplier of a second embodiment according to the present invention.

In this frequency multiplier, the output transmission line 13 of the first embodiment is replaced with a combination of the transmission lines 13 and 25 and a signal grounding RF shunt capacitor 26. An impedance of each transmission line is not limited to a characteristic impedance Z0, but determined in such a way that the frequency multiplier has a load impedance at which the output thereof is maximized.

In order to realize this, a first end of the transmission line 13 having a characteristic impedance Z3 is connected to the synthesis point T3 of waves from respective the FETs 10 and 11, and to the second end T2 thereof, connected is a first end of the transmission line 25 having a characteristic impedance Z4. To the second end of the transmission line 25, a drain bias voltage Vdd is applied, and this second end is grounded through the capacitor 26 for passing high frequency wave. Since a desired load impedance can be realized by a T circuit constituted of the transmission lines 13 and 25, the output amplitude of a wave component having a desired multiplied frequency can be maximized.

It should be noted that not only the T circuit but also any of various circuit configurations realizing a desired load impedance can be employed. The impedance Z2 of the transmission line 15 for phase adjustment is determined according to the input impedances of the FETs 10 and 11 such that the fundamentals are provided to respective FETs 10 and 11 in phase and with the same amplitude.

The input impedance Z1 of the input transmission line 12 is determined such that the input impedance of the frequency multiplier matches with the impedance of a microwave signal source, not shown, connected to the input terminal T1 of the input transmission line 12.

According to the frequency multiplier of the second embodiment, not only all the functions of the first embodiment but also the most optimal I/O condition can be realized.

Third Embodiment

Figure 3:
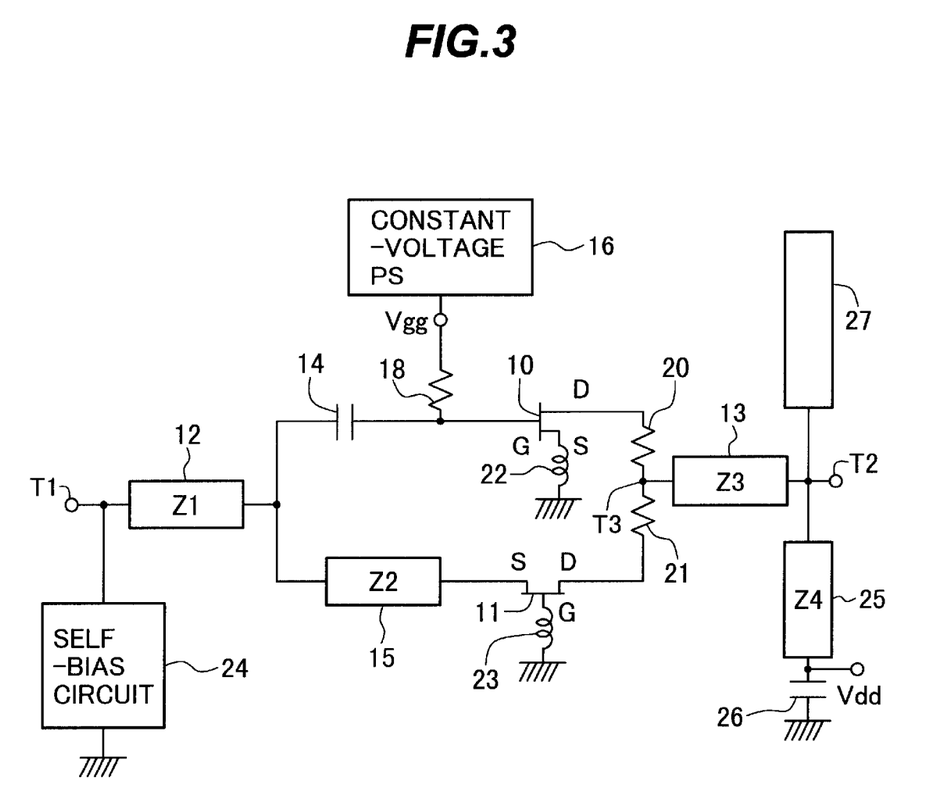
FIG. 3 is a circuit diagram showing a frequency multiplier of a third embodiment according to the present invention.

FIG. 3 is a circuit diagram showing a frequency multiplier by 4 of a third embodiment according to the present invention.

In this frequency multiplier, to the output T2 of the second embodiment, there is connected a transmission line 27 with an open end (an open stub) and having a length equal to ¼ times the wavelength of the second harmonic. Thereby, the second harmonic produced by the FETs 10 and 11 is trapped. Similar to the first and second embodiments, the odd harmonics are suppressed by synthesis in opposite phase, and further, the sixth or more even harmonics are negligibly small in amplitude.

Hence, almost only the fourth harmonic is outputted from the terminal T2, and for example, a wave of 10 GHz is effectively converted to a wave of 40 GHz. Further, phase noise of an oscillator employing the frequency multiplier by 4 can be suppressed to increase of 12 dB (according to a frequency multiplication principle, an increase of phase noise is 6 dB in a case where a frequency is doubled).

On the other hand, in an oscillator employing a dielectric resonator, phase noise is increased at a rate of about 20 dB/octave (an empirical rule derived from investigation into related articles).

Since a frequency multiplying scheme is most excellent in order to realize an oscillator having low phase noise in a millimeter wave, a high order frequency multiplier stably operable even in a millimeter wave like this third embodiment will have a wide range of applications.

As described above, the microwave frequency multiplier by 4 of the third embodiment can be realized by adding a stub for trapping to a microwave frequency multiplier by 2.

Without employing the damping resistances 20 and 21, the trapping stub interacts with the common gate FET 11 to cause new unstableness, or the unstableness is converted into a some form of inconvenience. Such a situation makes design very complex and difficult. However, the unstableness can be eliminated by connecting the damping resistances 20 and 21, therefore a stable frequency multiplying operation can be performed.

Figure 4:
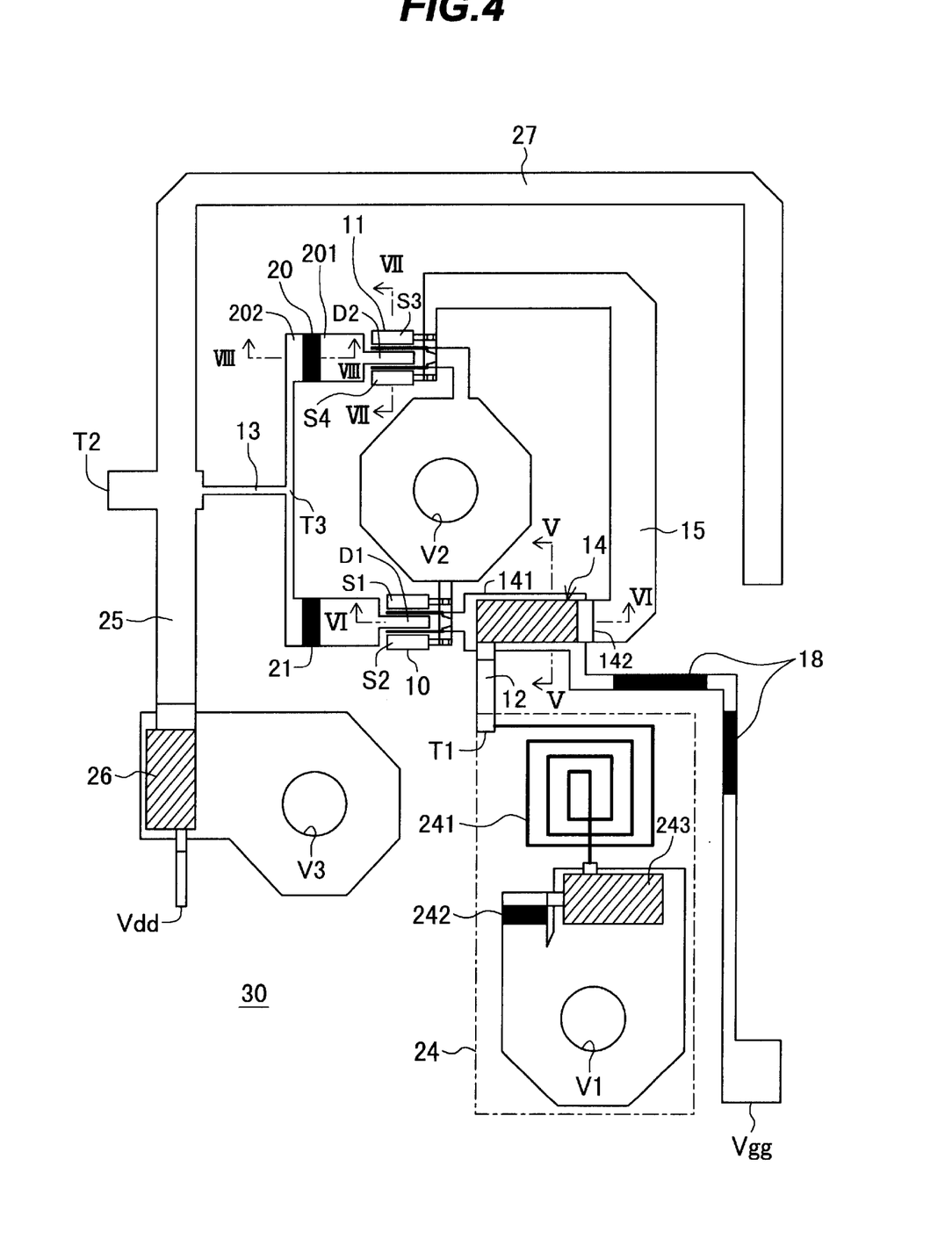
FIG. 4 is a layout diagram on a semi-insulating substrate realizing the circuit of FIG. 3.

FIG. 4 is a layout diagram on a semi-insulating substrate such as GaAs realizing the circuit of FIG. 3. Hatched portions of FIG. 4 represent dielectric regions of capacitors each having parallel metal films and a dielectric therebetween. A ground plane of a metal film is formed on the bottom surface of the semi-insulating substrate. Each transmission line is a strip line constructed of a metal line on the top surface of the substrate, the ground plane and the semi-insulating substrate functioning as a dielectric interposed therebetween. Reference characters VI to V3 denotes vias each having metal film formed on the inner surface thereof and connected to the ground plane and metal film on the top surface of the substrate around the via. Each via may be filled with metal.

FIGS. 5 to 8 are enlarged, cross sectional views taken along V—V, VI—VI, VII—VII and VIII—VIII lines, respectively, in FIG. 4.

Figure 5:
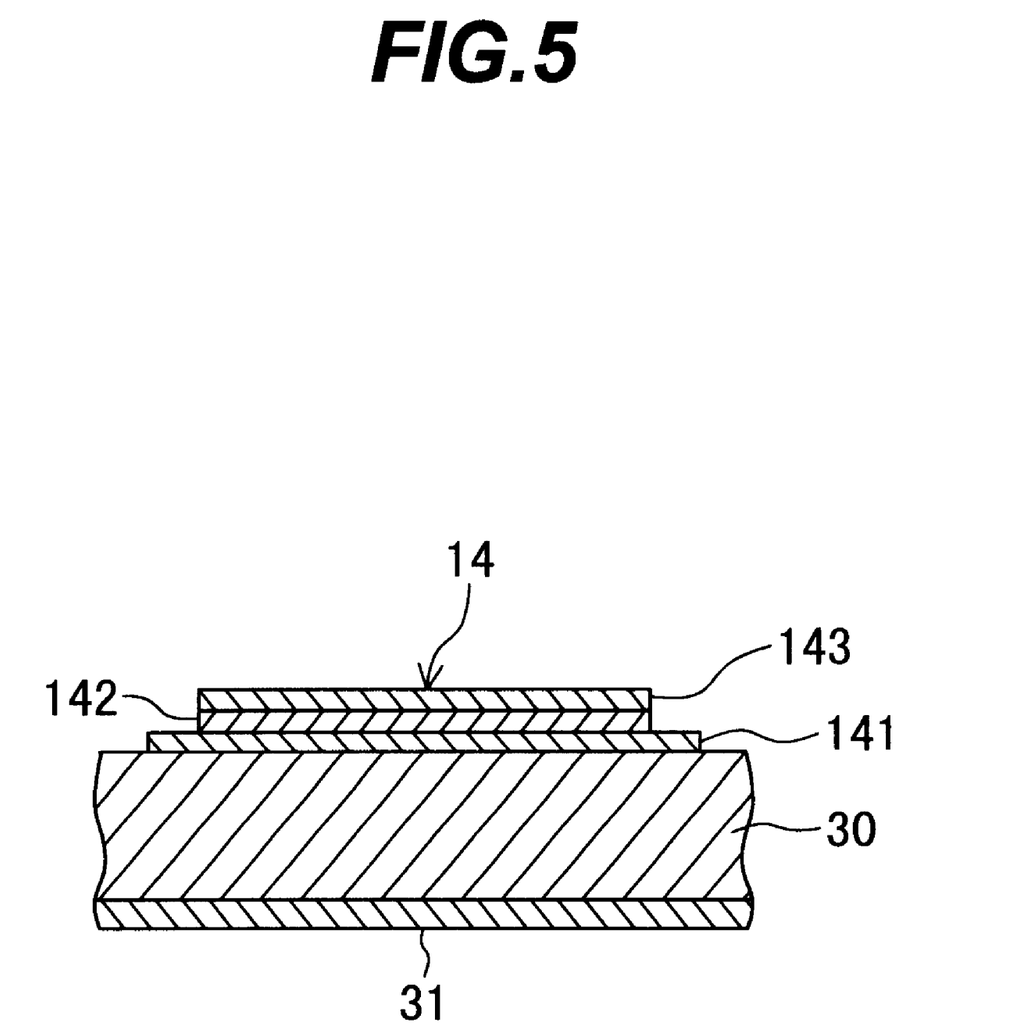
FIG. 5 is an enlarged, cross sectional view taken along V—V line in FIG. 4.

In FIG. 5, a reference character 30 indicates the semi-insulating substrate, 31 the ground plane, 141 to 143 a metal film, a dielectric and a metal film, respectively, of the capacitor 14.

Figure 6:
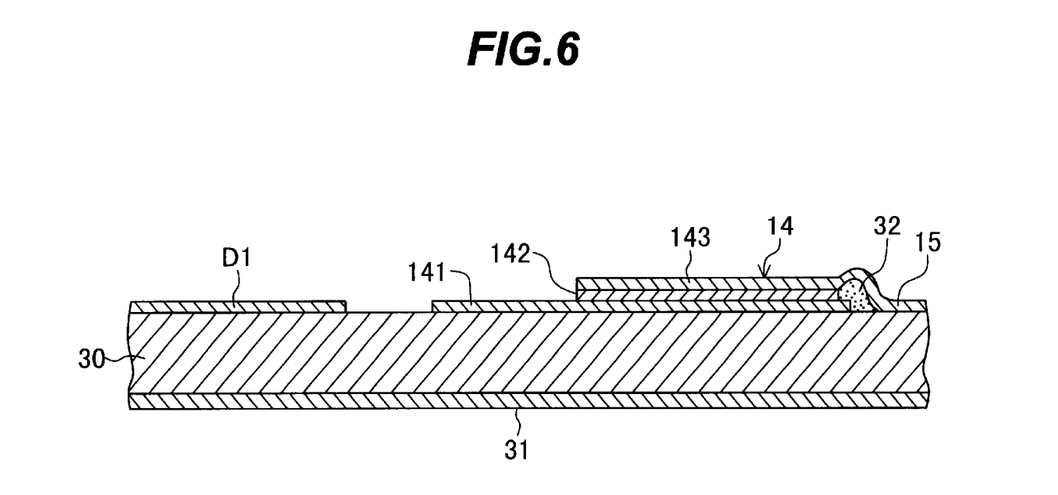
FIG. 6 is an enlarged, cross sectional view taken along VI—VI line in FIG. 4.

In FIG. 6, D1 indicates the drain electrode of the FET 10 and 32 an electrical insulator.

Figure 7:
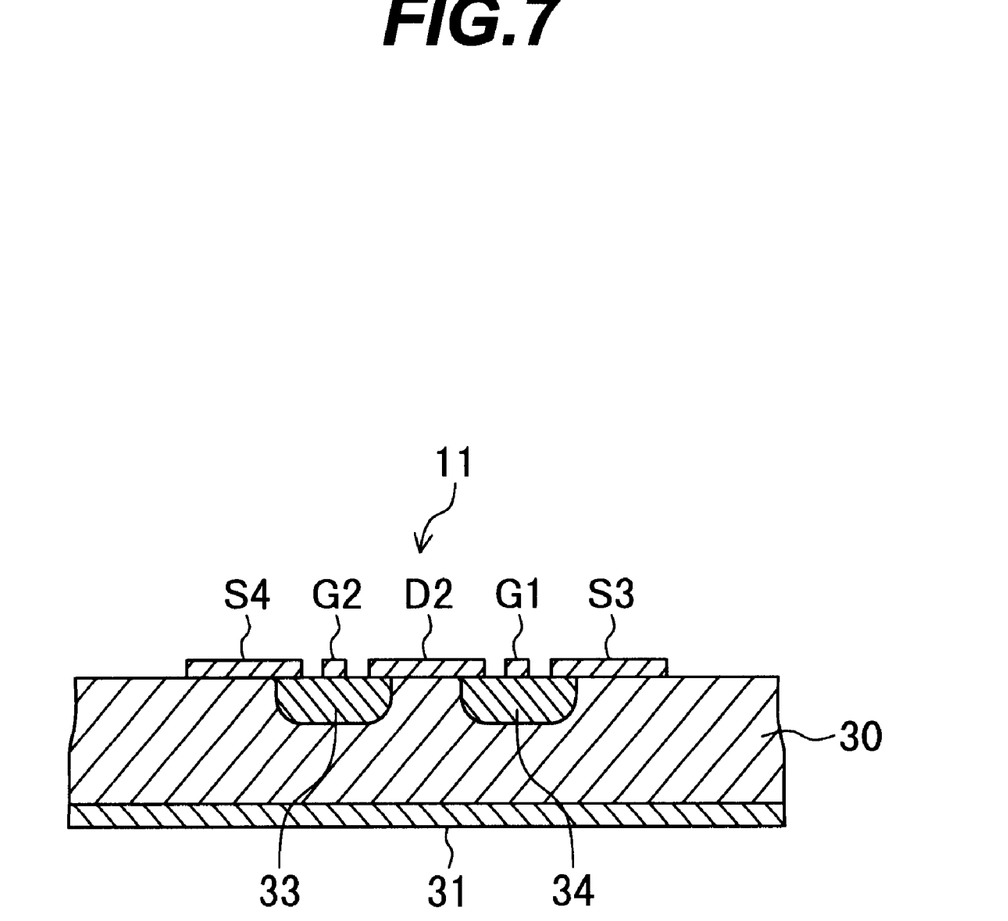
FIG. 7 is an enlarged, cross sectional view taken along VII—VII line in FIG. 4.

In FIG. 7, reference characters 33 and 34 indicate operation layers formed by implantation of impurity ions into the semi-insulating substrate 30, G1 and G2 gate electrodes, D2 a drain electrode, and S3 and S4 source electrodes. The FET 11 is of a MES structure and constructed of two transistors connected in parallel to each other, the sources S3 and S4 are connected to each other by a line not shown, and the gates G1 and G2 are connected to each other by a line not shown.

Figure 8:
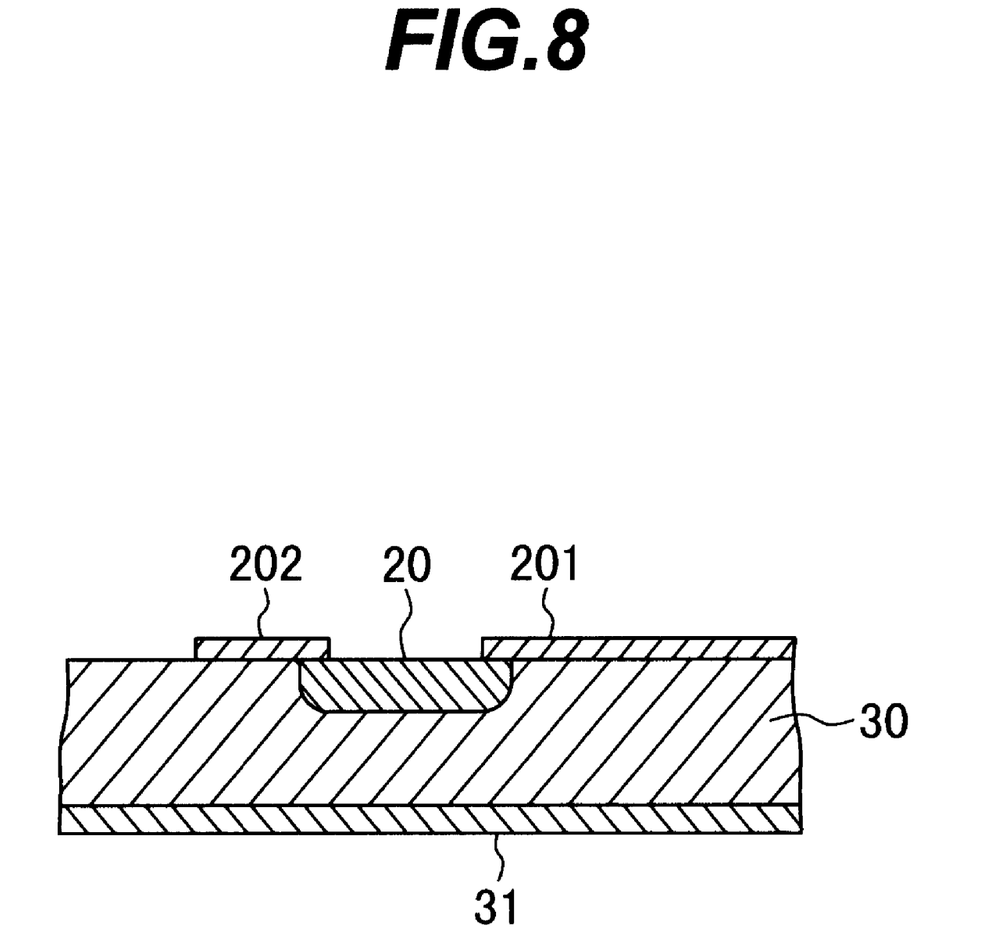
FIG. 8 is an enlarged, cross sectional view taken along VIII—VIII line in FIG. 4.

In FIG. 8, the resistance 20 is formed by implanting impurity ions into the semi-insulating substrate 30, and reference characters 201 and 202 are lines connected to opposite sides of the resistance 20.

In FIG. 4, the source electrodes S1 and S2 of the FET 10 and the gate electrodes (G1 and G2 of FIG. 7) of the FET 11 are all connected to the ground plane 31 through metal lines, a metal hexagon, and the via V2.

A resistance 18 has two resistances connected in series to each other in order to increase a value thereof and each of the two is formed similar to the resistance 20 of FIG. 8.

A self-bias circuit 24 has a configuration of general use, comprising a spiral inductor 241 having a first end connected to the input terminal, resistance 242, and ac grounding capacitor 243, wherein a first plane electrode of the capacitor 243 is connected to the second end of the spiral inductor 241 and a first end of the resistance 242, and the second plane electrode of the capacitor 243 and a second end of the resistance 242 are both connected to the ground plane 31 through the via V1. A dc current flowing from the drain to the source of the FET 11 further flows through the spiral inductor 241 and the resistance 242 to the ground plane 31. The value of the resistance 242 is determined such that the dc voltage between the both ends thereof is equal to the threshold voltage of the FET 11. The spiral inductor 241 can be used as a part for impedance matching since the impedance of the capacitor 243 can be neglected in an operating frequency of the frequency multiplier.

An open stub 27 is formed so as to surround the FETs 10 and 11 and the transmission line 15 in order to realize a down sized frequency multiplier.

FIGS. 9 to 12 show empirical results on the frequency multiplier of FIG. 4.

Figure 9:
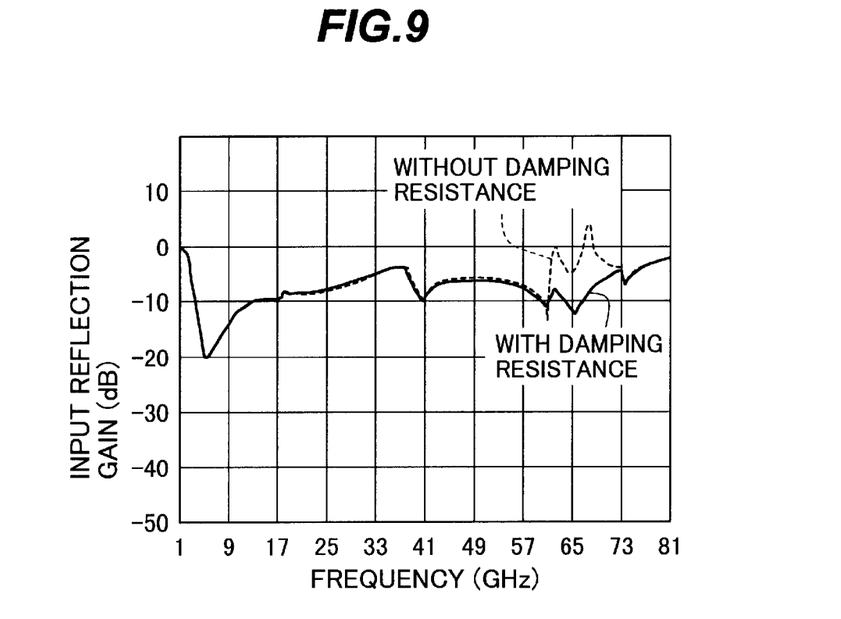
FIG. 9 is a graph showing frequency characteristics of input reflection gains of the frequency multiplier by 4 of FIG. 4 and another one having no damping resistances.
Figure 10:
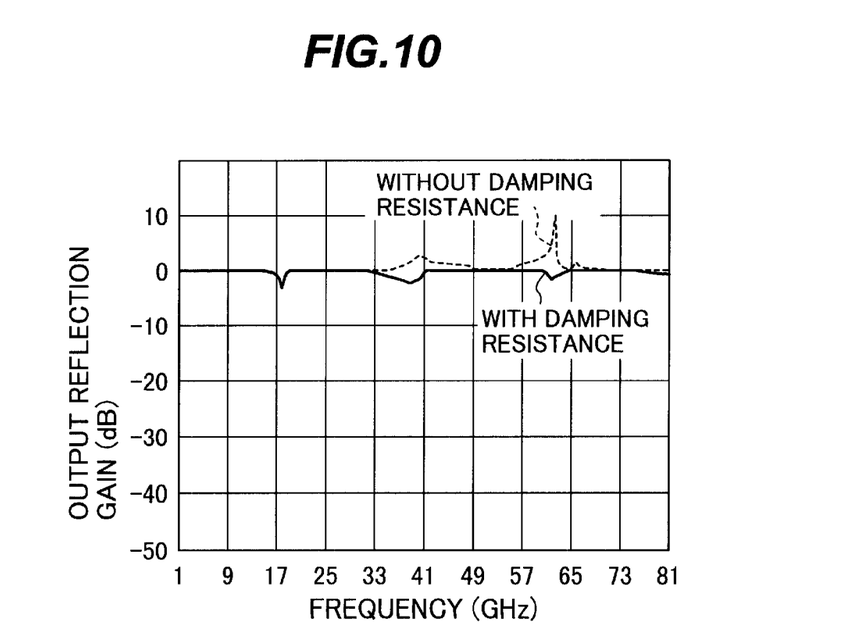
FIG. 10 is a graph showing frequency characteristics of output reflection gains of the two frequency multipliers.
Figure 11:
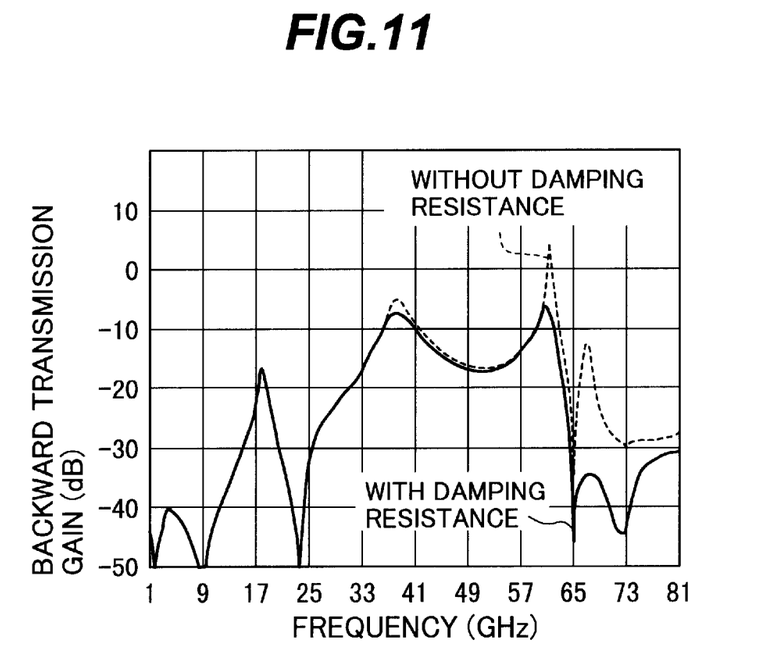
FIG. 11 is a graph showing frequency characteristics of backward transmission gains of the two frequency multipliers.

FIGS. 9 to 11 are graphs showing frequency characteristics of various S parameters, and solid lines indicate a case in which the frequency multiplier of FIG. 4 having the damping resistances 20 and 21 is used, and broken lines indicate a case in which another frequency multiplier of FIG. 4 having none of the damping resistances 20 and 21 is used, namely they are replaced with metal.

Design parameters of the frequency multiplier were determined according to specifications in which an input microwave of 9.5 GHz was converted into an output millimeter wave of 38 GHz, and the value of each damping resistance was 12 ohm.

FIG. 9 shows frequency characteristics of input reflection gains.

As can be seen from FIG. 9, there is a great difference between both characteristics in a frequency band of from 60 to 73 GHz, and the solid line means a stable operation without a reflection gain, while the broken line means an unstable operation in which the frequency characteristic of a reflection gain greatly varies and a several dB of the reflection gain is included. This would be considered that a spurious oscillation initially occurred somewhere in the above-described frequency band, and mutual modulations next occurred among this spurious oscillation, a fundamental and harmonics to generates many of spurious oscillations.

FIG. 10 shows frequency characteristics of output reflection gains.

Since the drain of the FET 10 has a high impedance, a reflection gain is around 0 dB. The solid line means a stable operation without a gain over all the frequencies, while the broken line means an unstable operation having a gain in a wide frequency range of from 33 to 70 GHz and especially a gain up to 10 dB at about 60 GHz.

FIG. 11 shows frequency characteristics of backward transmission gains.

Since the FETs 10 and 11 are essentially irreversible, a backward transmission gain must be greatly lower than 0 dB although a transmission amount increases with increase in frequency due to the parasitic susceptances of the FETs 10 and 11. However, with a frequency band exceeding 30 GHz, the backward transmission gains amounts to around −10 dB, which is a feedback effect of the parasitic inductances.

The solid line means a comparatively smooth change with the gain of under a little over −10 dB over all the frequencies, while the broken line means an unstable operation having a steep change in gain in frequencies between 60 GHz to 70 GHz and the gain close to 5 dB is also observed.

Figure 12:
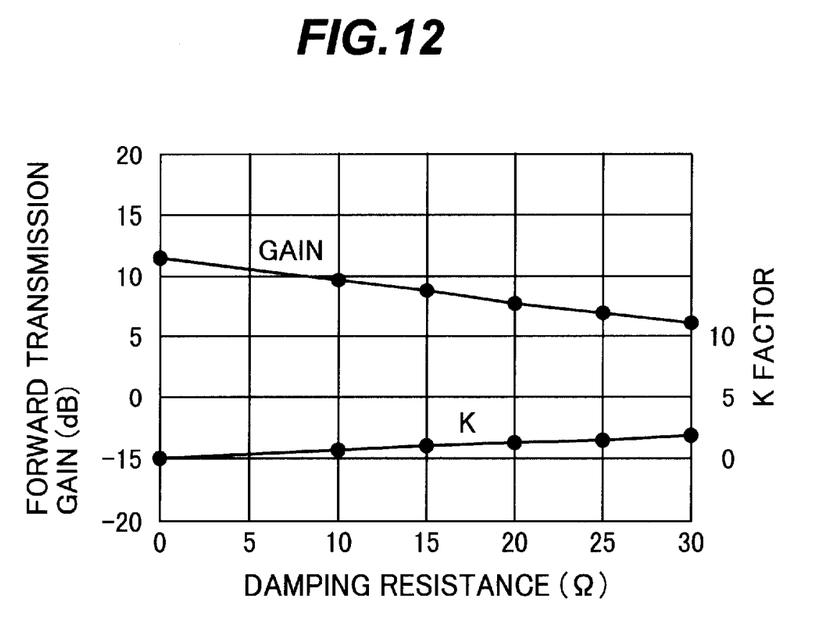
FIG. 12 is a graph of a forward transmission gain and a change in a K factor of the frequency multiplier by 4 of FIG. 4 in regard to a millimeter wave of 38 GHz for a damping resistance ranging from 0 to 30 $\Omega$.

FIG. 12 shows a forward transmission gain of the frequency multiplier by 4 of FIG. 4 in regard to a millimeter wave of 38 GHz for the damping resistance ranging from 0 to 30 Ω. When the damping resistance value is 12 ohm, a loss of the gain is about 2 dB, which is sufficiently small in practical use.

FIG. 12 also shows a K factor which is an stableness index. Unconditional stableness, namely K>1, is satisfied when the damping resistance is over a little under 12 ohm. Further, a range up to 20 ohm is practically allowable since a reduction in forward transmission gain is gentle with increasing in a damping resistance.

As described above, the damping resistances which is a important factor of the present invention can stabilize a frequency multiplier and make design easier and further, suppress a reduction in gain to a small value.

Fourth Embodiment

Figure 13:
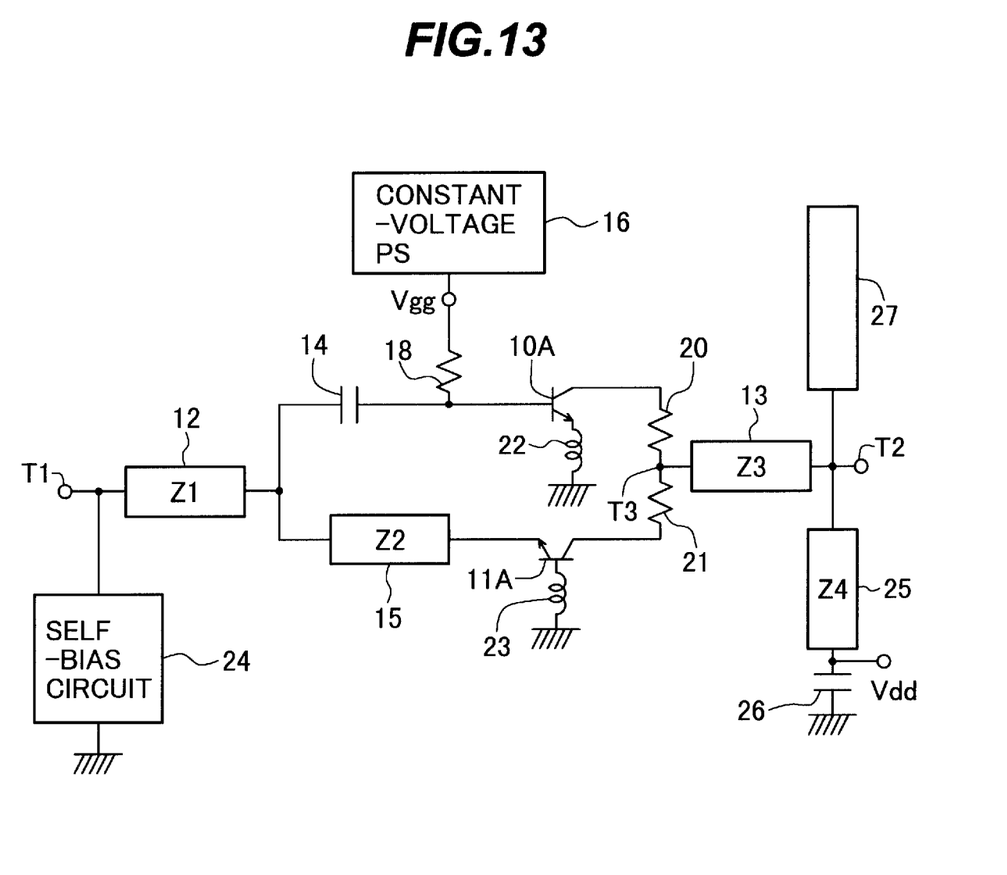
FIG. 13 is a circuit diagram showing a frequency multiplier of a fourth embodiment according to the present invention.

FIG. 13 is a circuit diagram showing a frequency multiplier of a fourth embodiment according to the present invention.

In this frequency multiplier, the FETs 10 and 11 in FIG. 3 are replaced-with respective bipolar transistors 10A and 11A. The collectors, bases and emitters of the bipolar transistors 10A and 11A correspond to respective drains, gates and sources of the FETs 10 and 11 of FIG. 13. As bipolar transistors, HBTs having high cutoff frequency are preferable.

The other points are the same as those in the above-described third embodiment.

Although preferred embodiments of the present invention has been described, it is to be understood that the invention is not limited thereto and that various changes and modifications may be made without departing from the spirit and scope of the invention.

What is claimed is:

1. A frequency multiplier comprising:
   an input transmission line, receiving an incoming microwave signal;
   an output transmission line;
   a first transistor, having a first control input and a first current path, said first control input being coupled to said input transmission line, a first end of said first current path being connected to ground;
   a second transistor, having a second control input and a second current path, said second control input being connected to ground, a first end of said second current path being coupled to said input transmission line;
   a first damping resistance, connected between a second end of said first current path and said output transmission line; and
   a second damping resistance, connected between a second end of said second current path and said output transmission line,
   wherein a value of said second damping resistance is determined so that said second damping resistance negates to form a pseudo-oscillating circuit comprising said second transistor and said output transmission line, and a value of said first damping resistance is determined so that a gain of a loop including said first and second transistors is less than 1 to suppress a loop oscillation.

2. The frequency multiplier of claim 1, further comprising:
   a stub, connected to said output transmission line, trapping a second harmonic.

3. The frequency multiplier of claim 1, further comprising:
   a resistance, connected to said first control input, through which a dc bias is supplied to said first control input;
   a dc cutoff capacitor, connected between said input transmission line and said first control input; and
   a self-bias circuit connected between said input transmission line and ground.

4. The frequency multiplier of claim 2, further comprising:
   a resistance, connected to said first control input, through which a dc bias is supplied to said first control input;
   a dc cutoff capacitor, connected between said input transmission line and said first control input; and
   a self-bias circuit connected between said input transmission line and ground.

5. The frequency multiplier of claim 4, further comprising:
   a transmission line, connected between said input transmission line and said first end of said second current path.

6. The frequency multiplier of claim 5, further comprising:
   a capacitor, having first and second electrode, said second electrode being grounded; and
   a transmission line, connected between said first electrode and said output transmission line.

7. The frequency multiplier of claim 1, wherein each of said first and second transistors is a field effect transistor.

8. The frequency multiplier of claim 2, wherein each of said first and second transistors is a field effect transistor.

9. The frequency multiplier of claim 3, wherein each of said first and second transistors is a field effect transistor.

10. The frequency multiplier of claim 4, wherein each of said first and second transistors is a field effect transistor.

11. The frequency multiplier of claim 5, wherein each of said first and second transistors is a field effect transistor.

12. The frequency multiplier of claim 6, wherein each of said first and second transistors is a field effect transistor.

13. The frequency multiplier of claim 1, wherein each of said first and second transistors is a bipolar transistor.

14. The frequency multiplier of claim 2, wherein each of said first and second transistors is a bipolar transistor.

15. The frequency multiplier of claim 3, wherein each of said first and second transistors is a bipolar transistor.

16. The frequency multiplier of claim 4, wherein each of said first and second transistors is a bipolar transistor.

17. The frequency multiplier of claim 5, wherein each of said first and second transistors is a bipolar transistor.

18. The frequency multiplier of claim 6, wherein each of said first and second transistors is a bipolar transistor.

19. A frequency multiplier comprising:

an input transmission line, receiving an incoming microwave signal;

an output transmission line;

a first transistor, having a first control input and a first current path, said first control input being coupled to said input transmission line, a first end of said first current path being connected through a via to a ground plane;

a second transistor, having a second control input and a second current path, said second control input being connected through said via to said ground plane, a first end of said second current path being coupled to said input transmission line;

a first damping resistance, connected between a second end of said first current path and said output transmission line; and a second damping resistance, connected between a second end of said second current path and said output transmission line.

20. The frequency multiplier of claim 19, further comprising a semi-insulating substrate, wherein said first and second transistors and said first and second damping resistances are formed on a first plane of said semi-insulating substrate, said ground plane is formed on a second plane of said semi-insulating substrate, and said via is formed through said semi-insulating substrate.

21. The frequency multiplier of claim 20, wherein a value of said second damping resistance is determined so that said second damping resistance negates to form a pseudo-oscillating circuit comprising said second transistor and said output transmission line, and a value of said first damping resistance is determined so that a gain of a loop including said first and second transistors is less than 1 to suppress a loop oscillation.

22. The frequency multiplier of claim 20, further comprising:

a stub, connected to said output transmission line, trapping a second harmonic.

23. The frequency multiplier of claim 20, further comprising:

a resistance, connected to said first control input, through which a dc bias is supplied to said first control input;

a dc cutoff capacitor, connected between said input transmission line and said first control input; and a self-bias circuit connected between said input transmission line and ground.

24. The frequency multiplier of claim 20, wherein each of said first and second transistors is a field effect transistor.

25. The frequency multiplier of claim 20, wherein each of said first and second transistors is a bipolar transistor.

\* \* \* \* \*